United States Patent
Powell et al.

(10) Patent No.: US 7,563,321 B2
(45) Date of Patent: Jul. 21, 2009

(54) PROCESS FOR PRODUCING HIGH QUALITY LARGE SIZE SILICON CARBIDE CRYSTALS

(75) Inventors: Adrian Powell, Cary, NC (US); Valeri F. Tsvetkov, Durham, NC (US); Mark Brady, Carrboro, NC (US); Robert T. Leonard, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/006,997

(22) Filed: Dec. 8, 2004

(65) Prior Publication Data

US 2006/0118037 A1  Jun. 8, 2006

(51) Int. Cl.
*C30B 23/00* (2006.01)
*H01L 29/04* (2006.01)

(52) U.S. Cl. ............... 117/84; 117/85; 117/86; 117/87; 117/88; 117/89; 257/49; 257/66

(58) Field of Classification Search ............ 117/83–89; 257/49, 66, E21.054, E21.066, E21.121, 257/E21.127, E21.221, E21.32, E21.321
See application file for complete search history.

(56) References Cited

U.S. PATENT DOCUMENTS

| | | | |
|---|---|---|---|
| 4,866,005 A | | 9/1989 | Davis et al. |
| 4,946,547 A | | 8/1990 | Palmour et al. |
| 5,200,022 A | | 4/1993 | Kong et al. |
| 5,210,051 A | * | 5/1993 | Carter, Jr. ............ 438/22 |
| 5,611,955 A | * | 3/1997 | Barrett et al. ........ 252/62.3 C |
| 5,937,317 A | * | 8/1999 | Barrett et al. ........ 438/493 |
| 6,218,680 B1 | * | 4/2001 | Carter et al. ........ 257/77 |
| 6,306,675 B1 | | 10/2001 | Tsong et al. |
| 6,376,900 B1 | | 4/2002 | Yamada et al. |
| 6,396,080 B2 | * | 5/2002 | Carter et al. ........ 257/77 |
| 6,600,203 B2 | | 7/2003 | Takahashi et al. |
| 6,639,247 B2 | | 10/2003 | Carter, Jr. et al. |
| 6,693,022 B2 | | 2/2004 | Dreybrodt et al. |
| 6,814,801 B2 | * | 11/2004 | Jenny et al. ........ 117/3 |
| 2001/0019132 A1 | | 9/2001 | Carter et al. |
| 2002/0059902 A1 | | 5/2002 | Vodakov et al. |

FOREIGN PATENT DOCUMENTS

| | | |
|---|---|---|
| JP | 01 108200 | 4/1989 |
| TW | 473908 | 1/2002 |

OTHER PUBLICATIONS

Sterling B. Hicks, Screw Dislocations and Charge Balance as Factors of Crystal Growth, American Mineralogist, vol. 40, pp. 139-146, 1955.

(Continued)

*Primary Examiner*—Robert M Kunemund
*Assistant Examiner*—G. Nagesh Rao
(74) *Attorney, Agent, or Firm*—Summa, Additon & Ashe, P.A.

(57) ABSTRACT

The invention is an improvement in the method of producing a high quality bulk single crystal of silicon carbide in a seeded sublimation system. In a first embodiment, the improvement comprises reducing the number of macrosteps in a growing crystal by incorporating a high concentration of nitrogen atoms in the initial one (1) millimeter of crystal growth.

23 Claims, 2 Drawing Sheets

OTHER PUBLICATIONS

D. Chaussende et al., Vapour-Liquid-Solid Mechanism for the Growth of SiC Homoepitaxial Layers by VPE, Journal of Crystal Growth, vol. 234, pp. 63-69, 2002.

Naitoh M et al, "Mechanism of nitrogren incorporation in sublimation growth of SiC," Journal of Crystal Growth, Elevier, Amsterdam, vol. 237-229, Apr. 2002, pp. 1192-1195.

Chaussende D et al., "Vapour-liquid-solid mechanism for the growth of SiC homoepitaxial layers by VPE," Journal of Crystal Grwoth, N. Holland Publ., Amsterdam, vol. 234, No. 1, Jan. 2002, pp. 63-69.

Search Report of foreign counterpart Taiwanese Application No. 094143375; completed Oct. 29, 2008; 2 pages.

* cited by examiner

PROCESS FOR PRODUCING HIGH QUALITY LARGE SIZE SILICON CARBIDE CRYSTALS

BACKGROUND

The present invention relates to the growth of silicon carbide for semiconductor purposes, and to the seeded sublimation growth of large, high quality silicon carbide single crystals. The invention particularly relates to improvements that reduce the defect density and polytype changes in large single crystals grown using seeded sublimation techniques.

Silicon carbide has found use as a semiconductor material for various electronic devices and purposes in recent years. Silicon carbide is especially useful due to its physical strength and high resistance to chemical attack. Silicon carbide also has excellent electronic properties, including radiation hardness, high breakdown field, a relatively wide band gap, high saturated electron drift velocity, high temperature operation, and absorption and emission of high energy photons in the blue, violet, and ultraviolet regions of the spectrum.

Single crystal SiC is often produced by a seeded sublimation growth process. In a typical silicon carbide growth technique, a seed crystal and a source powder are both placed in a reaction crucible which is heated to the sublimation temperature of the source and in a manner that produces a thermal gradient between the source and the cooler seed crystal. The thermal gradient encourages vapor phase movement of the materials from the source to the seed followed by condensation upon the seed and the resulting bulk crystal growth. The method is also referred to as physical vapor transport (PVT).

In a typical silicon carbide growth technique, the crucible is made of graphite and is heated by induction or resistance, with the relevant coils and insulation being placed to establish and control the desired thermal gradients. The source powder is silicon carbide, as is the seed. The crucible is oriented vertically, with the source powder in the lower portions and the seed positioned at the top, typically on a seed holder; see U.S. Pat. No. 4,866,005 (reissued as No. RE34,861). These sources are exemplary, rather than limiting, descriptions of modern seeded sublimation growth techniques.

It has proven difficult, however, to produce large, high quality bulk single crystals of silicon carbide by the typical seeded sublimation techniques. Large crystals grown according to the typical methods suffer from the presence of a large number of defects. The 150 available polytypes of SiC raise a particular difficulty. Many of these polytypes are very similar, often separated only by small thermodynamic differences. Maintaining the desired polytype identity throughout the crystal is only one difficulty in growing SiC crystals of large sizes in a seeded sublimation system.

Preferred polytype SiC crystals for semiconductor applications are 4H and 6H. These crystals are preferably grown with a convex surface to better enable the maintenance of polytype registry. The convex surface consists of a series of steps, from the peak of the dome to the sides of the crystal. Preferably, the steps are microsteps—those with a depth of less than 1 μm, more preferably less than about 500 nm. Microsteps promote consistent polytype registry during crystal growth, because polytype information from the seed is readily available to the depositing vapors. When the convex surface includes macrosteps—those with a depth of 1 μm or greater, this implies that there are larger terraces on the crystal surface that do not contain microsteps. This, in turn, leads to a loss of polytype registry.

Failure to maintain the polytype registry of a crystal during growth will typically result in a crystal having a high level of defects. Defects that can result from polytype changes include micropipes and dislocations. High concentrations of micropipe defects cause significant problems in limiting the performance characteristics of devices made on substrates fabricated from the crystals. For example, a typical micropipe defect density in some commercially available silicon carbide wafers can be on the order of 100 per square centimeter ($cm^{-2}$). A megawatt device formed in silicon carbide, however, requires a micropipe free area on the order of 0.4 $cm^{-2}$. Thus, obtaining large single crystals that can be used to fabricate large surface area devices for high-voltage, high current applications remains difficult.

It would therefore be desirable to develop a method for reducing the presence of macrosteps on the growing surface of a bulk single crystal of SiC in order to produce micropipe-free, high quality bulk single crystals.

SUMMARY OF THE INVENTION

The invention is an improvement in the method of producing a high quality bulk single crystal of silicon carbide in a seeded sublimation system. In a first embodiment, the improvement comprises reducing the number of macrosteps in a growing crystal by incorporating a high concentration of nitrogen atoms in the initial one (1) millimeter of crystal growth.

In another aspect, the invention is a high quality bulk single crystal of silicon carbide having dopant concentrations of between about $10^{18}$ $cm^{-3}$ and $10^{19}$ $cm^{-3}$ in the first one (1) millimeter of the crystal.

In yet another aspect, the invention is a high quality bulk single crystal of silicon carbide having nitrogen levels of between about $10^{18}$ $cm^{-3}$ and $10^{19}$ $cm^{-3}$ in the first one (1) millimeter of the crystal.

In a further aspect, the invention is a high quality bulk single crystal of silicon carbide having nitrogen levels of between about $10^{18}$ $cm^{-3}$ and $10^{19}$ $cm^{-3}$ in the first one (1) millimeter of the crystal and nitrogen levels below about $2\times10^{18}$ $cm^{-3}$ in the remainder of the crystal.

The foregoing and other objects and advantages of the invention and the manner in which the same are accomplished will become clearer based on the following detailed description taken in conjunction with the following drawings.

DETAILED DESCRIPTION

Figure 1:
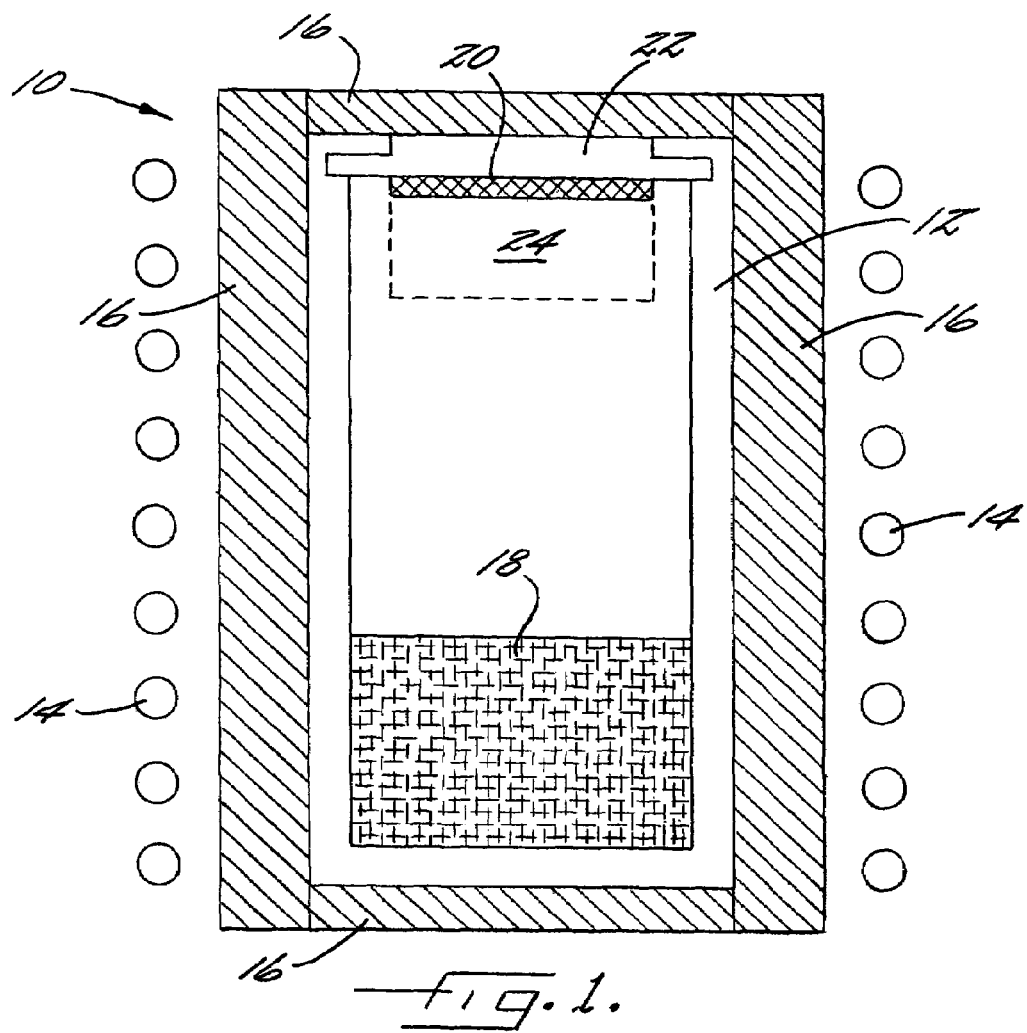
FIG. 1 is a cross sectional schematic diagram of a sublimation system for seeded sublimation growth.

The present invention relates to a method for producing high quality bulk single crystals of silicon carbide. In particular, the present invention incorporates several techniques for improving the growth of such crystals using seeded sublimation. The invention is described in terms of the sublimation growth of silicon carbide, but is not limited to silicon carbide per se.

As noted in the background portion of the specification, the general aspects of seeded sublimation growth of silicon carbide have been generally well established for a number of years. Furthermore, those familiar with the growth of crystals, particularly in difficult material systems such as silicon carbide, will recognize that the details of a given technique can and will vary, usually purposefully, depending upon the relevant circumstances. Accordingly, the descriptions given herein are most appropriately given in a general and schematic sense with the recognition that those persons of skill in this art will be able to carry out the improvements of the invention based on the disclosures herein without undue experimentation.

In a first broad aspect, the invention is an improvement in a method of producing a high quality bulk single crystal of silicon carbide in a seeded sublimation system. The improvement is initiating the sublimation growth in the presence of sufficient partial pressure nitrogen to produce a concentration of between about $10^{18}$ cm$^{-3}$ and $10^{19}$ cm$^{-3}$ in the crystal for about the first one (1) millimeter of growth and thereafter continuing growth in the presence of a partial pressure of nitrogen that reduces the concentration of nitrogen in the crystal to less than about $2 \times 10^{18}$ cm$^{-3}$ for the remainder of the sublimation growth.

In another aspect, the invention is a method of producing a high quality bulk single crystal of silicon carbide in a seeded sublimation system. The method includes placing a SiC seed on a seed holder in a crucible and evacuating the crucible to remove ambient air and other impurities. Next, placing the crucible under inert gas pressure and heating the system to SiC sublimation temperatures begins the process. Reducing the inert gas pressure of the system initiates growth; and introducing dopant gases at approximately 400 torr inert gas produces a dopant concentration of between about $10^{18}$ cm$^{-3}$ and about $10^{19}$ cm$^{-3}$ in the initial growth stages of the process. Preferred inert gas pressures are noble gas pressures. After the initial growth of approximately 1 mm, reducing the partial pressure of dopant gases results in dopant concentrations at or below about $2 \times 10^{18}$ cm$^{-3}$ throughout the remainder of the growth process.

In another aspect, the invention is a method of producing a high quality bulk single crystal of silicon carbide having reduced macrosteps in a seeded sublimation growth process. Reducing macrosteps at a crystal growth surface tends to result in improved single polytype crystal growth. Without being bound by theory, it is believed that macrosteps can be reduced by first initiating a seeded sublimation growth in the presence of a partial pressure of nitrogen sufficient to produce a concentration of between about $10^{18}$ cm$^{-3}$ and $10^{19}$ cm$^{-3}$ in the crystal for about the first one millimeter of growth; and thereafter continuing growth in the presence of an amount of nitrogen that reduces the concentration of nitrogen in the crystal to about $2 \times 10^{18}$ cm$^{-3}$ or less for the remainder of the sublimation growth.

In another embodiment, the invention is a method for reducing the presence of macrosteps in the production of high quality bulk single crystal silicon carbide during seeded sublimation growth. The method includes increasing the partial pressure of dopant gases during initial stages of crystal growth until the concentration of the dopants is about $10^{19}$ cm$^{-3}$; and thereafter reducing the partial pressure of the dopant gases until the concentration of dopant atoms in the remainder of the crystal is at or below about $2 \times 10^{18}$ cm$^{-3}$.

FIG. 1 is a cross sectional schematic diagram of a sublimation system for seeded sublimation growth of the type contemplated as useful in the present invention. The system is broadly designated at 10. As in most typical systems, the system 10 includes a graphite susceptor, or crucible, 12 and a plurality of induction coils 14 that heat the susceptor 12 when current is applied through the coils 14. Alternatively, some systems incorporate resistance heating. It will be understood by those familiar with these crystal growth techniques that the system can be further enclosed in some circumstances, e.g., in a water-cooled quartz vessel. Such further enclosures are, however, less relevant to the invention and are omitted herein to help clarify the drawing and description. Additionally, those persons skilled in this art recognize that silicon carbide sublimation systems of the type described herein are available both commercially and as constructed in a custom fashion as may be necessary or appropriate. They accordingly can be selected or designed by those of ordinary skill in this art without undue experimentation.

The susceptor 12 is typically surrounded by insulation 16, several portions of which are illustrated in FIG. 1. Although FIG. 1 illustrates the insulation as being generally consistent in size and placement, it will be understood and is recognized by those of skill in the art that the placement and amount of the insulation 16 can be used to provide desired thermal gradients (both axially and radially) along the susceptor 12. Again, for purposes of simplification, these possible permutations are not illustrated herein.

The susceptor 12 includes one or more portions for containing a silicon carbide powder source 18. Such a powder source 18 is most commonly—although not exclusively—used in seeded sublimation growth techniques for silicon carbide. FIG. 1 illustrates the powder source 18 as being contained in a lower portion of the susceptor 12 and this is one typical arrangement. As another familiar variation, some systems distribute the source powder in a vertical, cylindrical arrangement in which the source powder surrounds a larger portion of the interior of the susceptor 12 than does the arrangement illustrated in FIG. 1. The invention described herein can be appropriately carried out using both types of equipment.

The silicon carbide seed crystal is designated at 20, and is typically placed in upper portions of the susceptor 12. A seed holder 22 typically holds the seed 20 in place with the seed holder 22 being attached to the susceptor in an appropriate fashion as known in the art. In the orientation illustrated in FIG. 1, the upper portions of the seed holder 22 would typically be attached to uppermost portions of the susceptor 12 to hold the seed 20 in the desired position. The seed holder 22 is preferably a graphite seed holder.

The growing crystal is illustrated by the dotted rectangle designated 24. Preferably, the growing single crystal 24 has the same diameter as the seed 20.

The general scheme for sublimation growth is set forth briefly in the Background portion of the specification, as well as in other sources well-known to those of ordinary skill in this art. Typically, an electric current, having a frequency to which the susceptor 12 responds, is passed through the induction coils 14 to heat the graphite susceptor 12. The amount and placement of the insulation 16 are selected to create a thermal gradient between the powder source 18 and the growing crystal 24 when the susceptor 12 heats the powder source 18 to sublimation temperatures, which are typically on the order of between about 2000° C. and about 2500° C. The thermal gradient is established to maintain the temperature of the seed 20 and thereafter the growing crystal 24 near or above the sublimation temperature of silicon carbide to thereby thermodynamically encourage the vaporized species that are generated when silicon carbide sublimes (Si, Si$_2$C, and SiC$_2$) to condense first upon the seed crystal and thereafter upon the growing crystal. As one example, U.S. Pat. No. 4,866,005 suggests maintaining the seed at about 2300° C.

In one aspect of the present invention, dopant introduction occurs when the Ar pressure of the sublimation system reaches approximately 400 torr during Ar pressure reduction.

Preferably, the partial pressure of the dopant gas is maintained at a high level until after the initial stages of crystal growth. Dopant concentrations are preferably between about $10^{18}$ cm$^{-3}$ and $10^{19}$ cm$^{-3}$ during the first millimeter of crystal growth. Thereafter, reducing the partial pressure of the dopant gas results in standard dopant concentrations in the subsequently grown portions of the bulk single crystal.

After reaching the desired crystal size, growth is terminated by reducing the temperature of the system to below about 1900° C. and raising the pressure to above about 400 torr.

It may be further desirable to anneal the crystal after completion of the sublimation growth process. The crystal may be annealed at temperatures above about 2200° C. for a period greater than about 30 minutes.

For purposes of clarity, the singular term, "thermal gradient," will be used herein, but it will be understood by those of skill in this art that several gradients can desirably co-exist in the susceptor 12 and can be subcategorized as axial and radial gradients, or as a plurality of isotherms.

If the temperature gradients and other conditions (pressure, carrier gases, etc.) are properly maintained, the overall thermodynamics will encourage the vaporized species to condense first on the seed crystal 20 and grow to become the crystal 24 in the same polytype as the seed crystal 20.

In describing the invention, it will be understood that a number of techniques are disclosed. Each of these has individual benefit, and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

In considering the proportional dimensions of the diameter and thickness of the seed crystal, whether expressed as a percentage, a fraction, or a ratio, it will be understood that in the context of the improvements provided by the invention, these proportions have their inventive meaning in the context of the larger-diameter seed crystals that are described herein.

Accordingly, in certain embodiments the invention is described and claimed herein in the relevant embodiments in a manner that includes the absolute dimensions of the crystal, usually in terms of a diameter, of which 2 inch, 3 inch, and 100 mm diameter single crystals are preferred.

In yet another aspect, the invention is a high quality bulk single crystal of silicon carbide substrate having a 1 mm thick portion with a dopant concentration of between about $10^{18}$ cm$^{-3}$ and $10^{19}$ cm$^{-3}$. The remainder of the crystal has a dopant concentration below about $10^{18}$ cm$^{-3}$.

Figure 2:
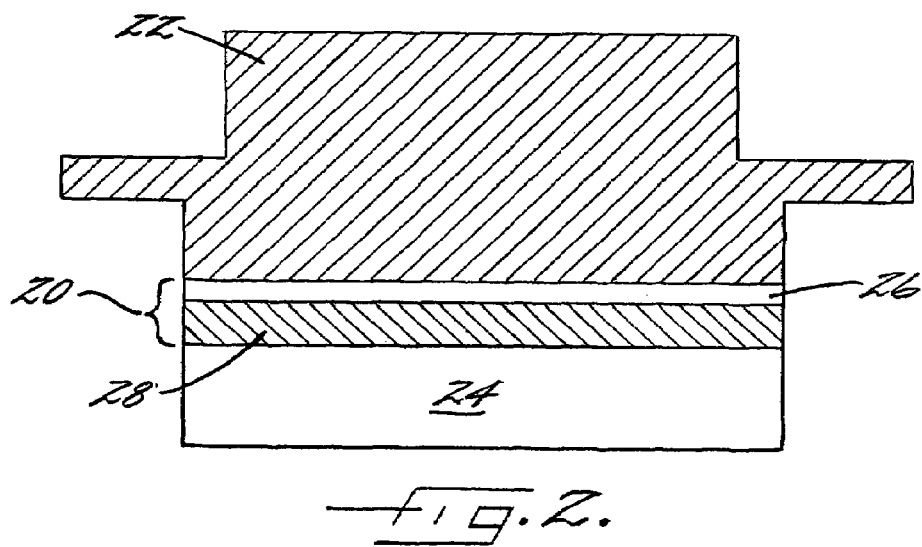
FIG. 2 is a schematic illustration of a bulk single crystal of silicon carbide attached to a seed holder.

FIG. 2 is a schematic illustration of a bulk single crystal of silicon carbide attached to a seed holder 22 and grown in accordance with the present invention. A seed of SiC 20 is attached to a seed holder 22. After sublimation is conducted as previously described, bulk single crystal growth occurs on the seed 20. The resultant single crystal includes at least a highly doped layer 26 and a conventionally doped layer 28 and has a total thickness of between about 5 and 75 mm.

The highly doped layer 26 of the bulk single crystal 24 is preferably doped with n-type dopants. Preferred n-type dopants include N, P, As, Sb, Bi, and mixtures thereof. Nitrogen is an especially preferred dopant. The highly doped layer 26 preferably has a dopant concentration of between about $10^{18}$ cm$^{-3}$ and $10^{19}$ cm$^{-3}$. If the dopant concentration of the highly doped region 26 has a dopant concentration higher than about $10^{19}$ cm$^{-3}$, then the resultant bulk single crystal 24 may have too much inherent stress, resulting in stacking faults and dimensional instability. The highly doped layer is preferably about one (1) mm thick. In a preferred embodiment, the first millimeter of growth defines the highly doped layer 26.

The conventionally doped layer 28 of the bulk single crystal 24 may be doped or undoped. The conventionally doped layer 28, when doped, is preferably doped with n-type dopants. Preferred n-type dopants include N, P, As, Sb, Bi, and mixtures thereof. Nitrogen is an especially preferred dopant. The conventionally doped layer 28 preferably has a dopant concentration determined by the target device application. The conventionally doped layer is preferably between about 4 mm and 74 mm.

Bulk single crystals grown in accordance with the present invention have reduced surface macrosteps. Preferably, the growth surface is substantially free of macrosteps. As stated earlier, macrosteps are steps in the growth surface that are about 1 μm or greater in depth. The growth surface of crystals grown in accordance with the present invention allows the crystal to maintain a consistent polytype throughout the crystal. Preferred polytypes include the 3C, 4H, 6H, and 15R polytypes.

Figure 3:
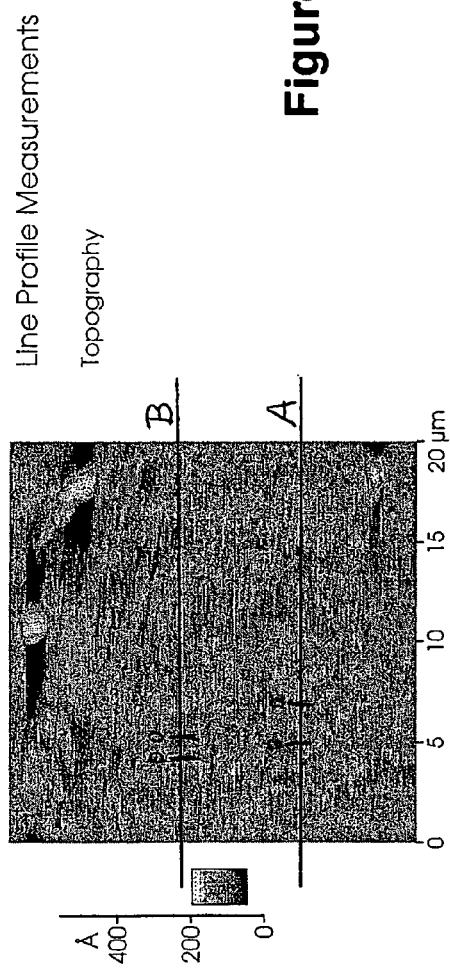
FIG. 3 is an Atomic Force Microscopy (AFM) photograph, and accompanying height profiles, of the surface of a bulk single crystal of SiC grown in accordance with the present invention.
Figure 3:
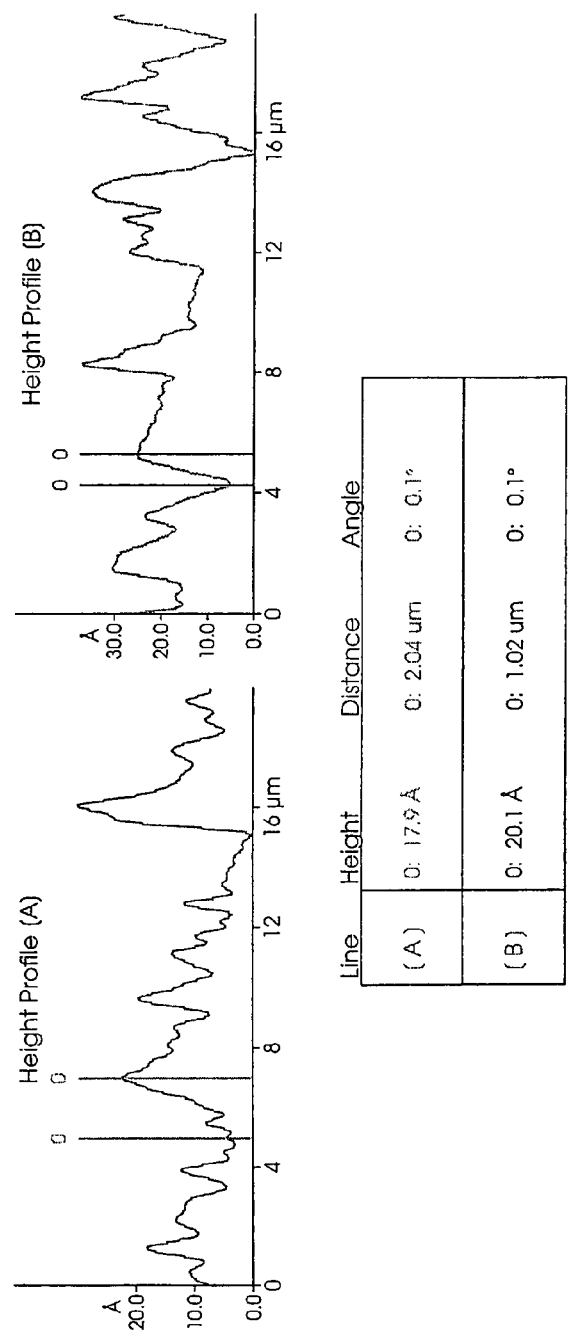

FIG. 3 is an Atomic Force Microscopy (AFM) photograph and height profiles of the surface of a high quality bulk single crystal of SiC grown in accordance with the present invention. As can be seen from the height profiles in FIG. 3, the surface morphology of the single crystal varies by no more than about 30 or 40 angstroms (Å) and often less, thus demonstrating an absence of macrosteps.

Without being bound by theory, it is believed that the presence of macrosteps unfavorably increases the phenomena of liquid reactants pooling on the growth surface of the growing crystal. Macrosteps allow more locations for the liquid reactants to pool on the growth surface. The presence of liquid reactants, or step bunching, initiates secondary nucleation of different polytypes on the growth face. As previously discussed, such polytype changes lead to the presence of defects, such as micropipe defects, in the resultant crystals.

The creation of liquid on the surface occurs by excretion of excess silicon during the growth steps as a result of SiC crystal growth from the non-stoichiometric vapor phase. This free silicon produces a liquid layer at the growth surface that leads to step bunching and hence macrosteps because of the vapor-liquid-solid growth mechanism formation as described by Chaussende et al. ("Vapor-liquid-solid mechanism for the growth of SiC homoepitaxial layers by VPE" *Journal of Crystal Growth*, 234 (2002) 63-69). High concentrations of n-type dopant atoms, preferably nitrogen, in the vapor phase etch away the layer of liquid silicon at the growth steps according to Equation (1) and consequently prevent the step bunching formation. Desired high concentrations of n-type dopant atoms in the vapor phase may be achieved by the methods of the present invention.

$$2Si_{(l)} + N_{2(g)} \rightarrow 2SiN_{(g)} \tag{1}$$

Without being bound by theory, it may also be possible to achieve the same result, i.e., reduction of free silicon on the growing surface by supplying excess carbon containing species during the growth of the SiC crystal.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. In a method of producing a high quality bulk single crystal of silicon carbide in a seeded sublimation system, the improvement comprising:

reducing excess Si at a growing surface by initiating the sublimation growth from a source powder on a seed crystal at sublimation temperatures in the presence of a partial pressure of nitrogen sufficient to produce a concentration of nitrogen of between about $10^{18}$ cm$^{-3}$ and about $10^{19}$ cm$^{-3}$ in the crystal for about the first one (1) millimeter of sublimation growth; and continuing sublimation growth to a thickness of at least 5 millimeters in the presence of a partial pressure of nitrogen that reduces the concentration of nitrogen in the growing crystal to less than about $10^{18}$ cm$^{-3}$ for the remainder of the sublimation growth of the bulk crystal.

2. A method according to claim 1 wherein the step of initiating sublimation growth in the presence of nitrogen includes introducing nitrogen to the sublimation system at about 400 torr Ar pressure.

3. A method according to claim 1 further comprising reducing the partial pressure of nitrogen in the seeded sublimation system after the initial growth stage of the single crystal silicon carbide.

4. A method according to claim 1 comprising initiating growth with a seed crystal of silicon carbide substrate that has a polytype selected from the group consisting of the 3C, 4H, 6H, and 15R polytypes.

5. A method according to claim 4 comprising growing the bulk single crystal at substantially the same diameter as the seed crystal.

6. A method of producing a high quality bulk single crystal of silicon carbide in a seeded sublimation system, the method comprising:

placing a SiC seed on a seed holder in a crucible;

evacuating the crucible to remove ambient air and other impurities;

placing the crucible under inert gas pressure;

heating the system to SiC sublimation temperatures;

reducing the inert gas pressure to initiate sublimation SiC growth from a source powder to the seed crystal;

introducing dopant gases at approximately 400 torr or below inert gas pressure to produce a dopant concentration of between about $10^{18}$ cm$^{-3}$ and about $10^{-3}$ cm in the first one (1) millimeter of sublimation growth to thereby reduce free Si on a growing surface of the seed crystal; and continuing the sublimation growth while reducing the partial pressure of dopant gases to the appropriate levels to achieve dopant concentrations at or below about $10^{18}$ cm$^{-3}$ to a thickness of at least 5 millimeters throughout the remainder of the growth process.

7. A method according to claim 6 wherein the step of placing a SiC seed on a seed holder comprises placing the seed on a graphite seed holder.

8. A method according to claim 6 further comprising stopping growth by raising the inert gas pressure in the crucible to above about 400 torr and lowering the temperature to below about 1900° C. to stop crystal growth.

9. A method according to claim 8 wherein the step of stopping growth occurs after between about 5 mm and about 75 mm of crystal growth.

10. A method according to claim 6 wherein the step of placing the crucible under inert gas pressure involves introducing an inert gas selected from the group consisting of noble gases and mixtures thereof.

11. A method according to claim 6 wherein the step of heating the system to SiC growth temperatures involves heating to temperatures between about 1900° and 2500° C.

12. A method according to claim 6 wherein the step of introducing dopant gases involves introducing dopant gases selected from the group consisting of N, P, As, Sb, Bi, and mixtures thereof.

13. A method according to claim 6 wherein the step of introducing dopant gases involves introducing nitrogen to the growth system.

14. A method according to claim 6 wherein the step of reducing the inert gas pressure to initiate SiC growth comprises reducing the inert gas pressure to below 400 torr.

15. A method according to claim 6 further comprising annealing the crystal after the completion of the crystal growth process.

16. A method of producing a high quality bulk single crystal of silicon carbide in a seeded sublimation system, the method comprising:

reducing the presence of macrosteps at a crystal growth surface by first initiating the seeded sublimation growth from a source powder at sublimation temperatures in the presence of a partial pressure of nitrogen sufficient to produce a concentration of between about $10^{18}$ cm$^{-3}$ and about $10^{19}$ cm$^{-3}$ in the crystal for about the first one (1) millimeter of sublimation growth; and continuing sublimation growth to a thickness of at least 5 millimeters in the presence of a partial pressure of nitrogen that reduces the concentration of nitrogen in the crystal to about $10^{18}$ cm$^{-3}$ or less for the remainder of the sublimation growth.

17. A method according to claim 16 wherein said step of initiating crystal growth occurs at or below about 400 torr Ar pressure.

18. A method according to claim 16 wherein the step of reducing the partial pressure of nitrogen for the remainder of the crystal growth process involves additional crystal growth of between about 5 mm and 75 mm.

19. A method according to claim 17 wherein the step of initiating crystal growth occurs at temperatures between about 2100 and 2500° C.

20. A method for reducing step bunching in the production of high quality bulk single crystal silicon carbide during seeded sublimation growth, the method comprising:

increasing the partial pressure of dopant gases during the first millimeter of sublimation crystal growth from a source powder at sublimation temperatures to produce a high concentration of dopant atoms in the vapor phase of the sublimation system during the first one millimeter of crystal growth; and continuing sublimation growth to a thickness of at least 5 millimeters while removing liquid silicon present on a growing surface of the bulk single crystal of silicon carbide by reaction with the dopant atoms in the vapor phase.

21. A method according to claim 20 wherein said dopant gases are selected from the group consisting of n-type dopant atoms.

22. A method according to claim 21 wherein said n-type dopant atoms are selected from the group consisting of N, P, As, Sb, Bi, and mixtures thereof.

23. A method according to claim 20 further comprising initiating growth with a seed crystal of silicon carbide substrate that has a polytype selected from the group consisting of the 3C, 4H, 6H, and 15R polytypes.

* * * * *